United States Patent [19]

Ghiraldi

[11] 4,263,963

[45] Apr. 28, 1981

[54] SHELTER

[75] Inventor: Alberto Ghiraldi, Milan, Italy

[73] Assignee: D. S. D. P. S.p.A., Milan, Italy

[21] Appl. No.: 949,382

[22] Filed: Oct. 6, 1978

[30] Foreign Application Priority Data

Oct. 27, 1977 [IT] Italy .............................. 29053 A/77

[51] Int. Cl.³ .............................................. F24H 3/00
[52] U.S. Cl. ................................... 165/47; 165/104 S;
  165/DIG. 4; 336/58; 361/380; 361/382
[58] Field of Search ............... 165/47, 104 S; 361/380,
  361/382, 383, 384; 336/55, 57, 58

[56] References Cited

U.S. PATENT DOCUMENTS

| | | | |
|---|---|---|---|
| 1,700,839 | 2/1929 | Gay | 165/47 |
| 2,825,034 | 2/1958 | Birchard | 165/104 S |
| 3,112,877 | 12/1963 | Snelling | 165/104 S |
| 3,590,327 | 6/1971 | Thomae | 361/380 |
| 3,629,758 | 12/1971 | Pearce | 336/57 |
| 3,780,356 | 12/1973 | Laing | 165/104 S |

Primary Examiner—Albert W. Davis
Assistant Examiner—Margaret A. Focarino
Attorney, Agent, or Firm—Wenderoth, Lind & Ponack

[57] ABSTRACT

The invention concerns a shelter device in the form of a box-like structure for the protection of electronic apparatuses against atmospheric agents.

The shelter comprises walls of insulating material forming a thermal resistance, as well as an amount of material(s) having a high specific heat operating inside the structure and forming a thermal capacity, the thermal resistance and capacity being able to maintain a shelter inner temperature that is constant and is correlated to the outer mean temperature over a time period of at least 24 hours.

9 Claims, 4 Drawing Figures

SHELTER

BACKGROUND OF THE INVENTION

1. Field of the Invention

This invention relates to a device for ensuring the protection against atmospheric agents of electronic or similar apparatuses, in particular high-reliability apparatuses when installed in zones having difficult climatic conditions and in positions difficult to be joined and to be supplied with conventional energy.

In the field of electronic apparatuses the prevailing trend is to reduce consumption and increase reliability, in particular for the purpose of reducing maintenance costs.

These two features must be considered as essential when such apparatuses operate in climatically difficult zones as well as in places difficult to be reached, devoid of conventional energy sources without the possibility of human supervision. The continuous improvement of the above-mentioned features has introduced the problem of effectively protecting the apparatuses not only against atmospheric agents, but also against extremely high or low environmental temperatures.

2. Description of the Prior Art

For the protection of these electronic apparatuses so-called "shelter" devices are normally used essentially in the form of box-like structures wherein these apparatuses are housed.

The known shelters always offer a protection against inclement weather and sometimes also provide a certain thermal insulation due to the thermal insulating material of their walls.

However, the power dissipated by the electronic apparatuses within such known shelters results in a positive temperature difference between the inner and outer wall surfaces, but the inner temperature always follows the daily and seasonal environmental temperature variations. This means that inside the shelter maximum and minimum temperature peaks about equal to those of the environmental temperature plus such temperature difference can be detected.

Accordingly, these known shelters are effective only if the maximum and/or minimum environmental temperature peaks, plus such difference, result in inside maximum and/or minimum temperature peaks which are compatible with a perfect operation of the apparatuses.

If the outside maximum and/or minimum temperature peaks do not satisfy the above condition, other solutions must be found. When the shelters must operate in zones wherein the maximum inside temperature peak, calculated as hereinabove, is greater than the allowable temperature, it is possible to provide shelters with automatically or manually controllable openings, in order to reduce the inside temperature to values corresponding to outside temperature. However this solution, which is effective only when the outside temperature is compatible with the operation of the apparatus, shows different drawbacks, as for example a reduced protection against inclement weather when the shelter is open, a poor reliability when the shelter opening is automatically controlled, or high costs in case of a manual shelter opening control.

Another solution is to provide shelters having air conditioners, heat pumps or other cooling or heating means. However this solution requires a considerable energy consumption for producing heat in or subtracting heat from the shelter, and involves the use of plants of low reliability.

OBJECTS OF INVENTION

An object of this invention is to provide a protection device or shelter, in particular for the uses as above outlined, wherein the above-stated problems and drawbacks of known shelters are solved and overcome and wherein a protection against maximum and/or minimum outside temperatures is ensured without using energy sources and independently from the reliability of temperature controlling plants.

SUMMARY OF THE INVENTION

According to this invention, a shelter is provided that consists in a closed box-like structure forming and/or cooperating with at least one thermal resistance and at least one thermal capacity which are calculated and dimensioned in such a manner as to maintain inside the structure substantially constant temperature values according to the mean environmental temperature in pre-established time periods. In particular, the thermal resistance is formed by a suitable insulating material forming the structure walls and/or cooperating therewith, while said thermal capacity is formed by a suitable quantity of a material having a high specific heat forming the box-like structure walls or cooperating therewith, inside the shelter.

In other words, according to this invention, a thermal filter of suitable characteristics is interposed between the shelter outside and inside. This thermal filter operates in such a manner as to limit the heat exchange with the outside by means of the insulation forming the thermal resistance, and to prevent the heat exchange with the outside which will substantially affect the shelter inside temperature variations, by using the thermal capacity as a stabiliser. Accordingly, when for example a heat exchange toward the shelter inside takes place, this heat increases the temperature of the thermal capacity and is actually "absorbed" by the same, so that only a minimum increase in the thermal capacity and shelter inside volume temperature takes place. In the same manner, when heat passes outwardly from the shelter, this heat is supplied by the thermal capacity and causes only a minimum temperature decrease. By suitably selecting the thermal resistance and capacity values in relation to the shelter volume and surface, to the outside temperatures and to the heat dissipated by the electronic apparatuses, it is possible to ensure a substantially constant temperature inside the shelter for pre-established time periods. Such periods can be greater than 24 hours, and during the same the shelter inner temperature corresponds to the mean value of the outside temperatures plus the temperature differences as caused by the energy from the electronic apparatuses. This latter temperature difference is smaller than that existing in known shelters, due to the influence of the thermal capacity.

Accordingly, the shelter inside temperature is no longer dependent on the maximum and minimimum peaks of the outside temperature, but only on the mean values of the outside temperature in a pre-established period of time, which in any case is at least equal to 24 hours.

For this reason, the shelter according to this invention will have a range of application much greater than that of the known common shelters, in particular when the pre-established period of time is extended by suitably selecting the thermal resistance and thermal capacity values, with the use of more than one thermal filter (each consisting of one resistance and one capacity) with a cascade connection. In addition, the shelter according to this invention may also be used in combination with heating and/or cooling devices for conditioning the inside of the shelter when the mean outside temperature conditions require such plants. In this case, a further advantage is given by a substantial reduction of the load and intervention periods of these plants.

DETAILED DESCRIPTION OF THE PREFERRED EMBODIMENTS

Figure 1:
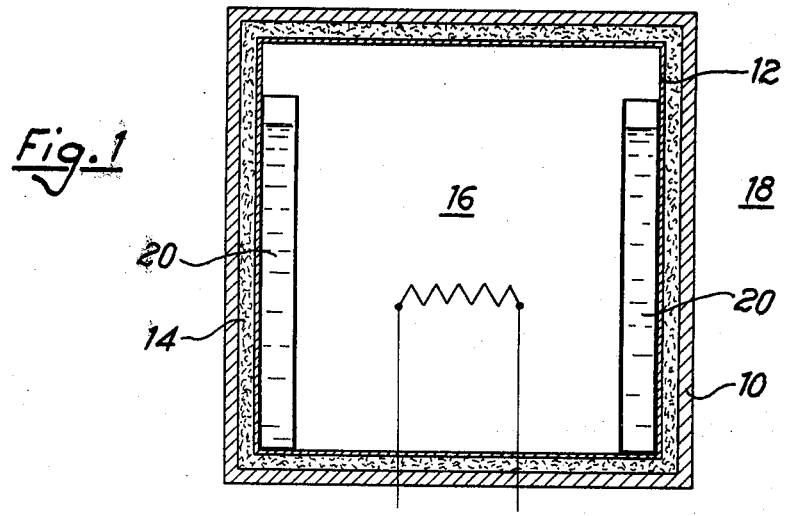
FIG. 1 is a schematic cross-section through a shelter according to this invention.

Referring to FIG. 1, a shelter according to this invention essentially and diagrammatically consists of a box-like carrying structure 10 with a suitable layer 14 of a heat-insulating material, for example polystyrene or foamed polyurethane or any other material having good insulation properties and, if possible, low weight. In the embodiment of FIG. 1, the insulating layer is interposed between two supporting and containing layers 10 and 12, but it is to be understood that the same may be positioned and arranged in any other manner, or even form itself the box-like structure, provided that it could ensure a satisfactory thermal insulation of the shelter inside space 16 that is sealed against the outside environment 18.

Under these conditions, as known, heat exchange in both directions between the inside space 16 and the outside environment 18 depends on different factors and mainly on the temperature difference between the two spaces and the insulating capacity or thermal resistance of the shelter walls. It is obvious that the amount of heat that is admitted to or subtracted from the inside space 16 directly influences the inside space temperature in a substantial manner. In order to reduce this effect, the invention provides, inside the shelter, a suitable thermal capacity, that is a suitable amount of a material having a high thermal capacity or high specific heat, as shown for example by the water containers 20 in FIG. 1, this material being in thermal heat exchange relationship with the space 16. Thus the heat exchange between the two spaces results in a much smaller effect on the temperature of the space 16, because the heat is in part supplied to or absorbed by the capacity 20, acting as a thermal stabilizer.

Accordingly, the shelters of this invention show the combination of two main features, i.e. to limit on one hand the heat exchanged with the outside space by means of a thermal resistance, and to reduce on the other hand the effect of this heat exchange on the inside shelter temperature by means of a thermal capacity or stabilizer. Further, by means of a suitable selection of such resistance and capacity, it is possible to obtain a substantially constant temperature within inside space 16 during preestablished time periods, usually in excess of 24 hours.

Figure 2:
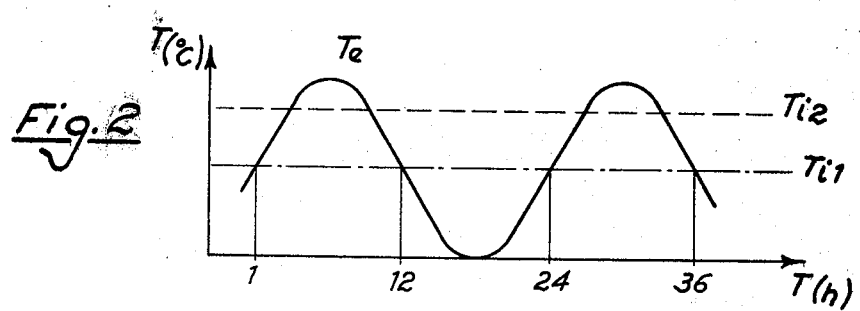
FIG. 2 is a diagram showing the temperature flows at the outside and at the inside of a shelter according to FIG. 1.

For example, assuming that the outside temperature flow is according to the curve Te of FIG. 2, by suitably sizing the thermal resistance and capacity, a substantially constant inside temperature $T_{i1}$ may be ensured, such temperature corresponding to the mean outside temperature within the considered 36 hour period. If the shelter houses a heat source, for instance formed by a heating device or by the same protected electronic apparatuses, the inside temperature will increase to $T_{i2}$, but will remain always constant. It must be observed that the temperature gap $T_{i2}-T_{i1}$, for example caused by the heat emission of the protected apparatuses, is reduced due to the presence of the thermal capacity 20, when compared to known shelters without such thermal capacity.

As already mentioned, the thermal capacity 20 consists of a suitable amount of a substance having a high specific heat, for instance water. For reasons of constructional convenience, other materials can be used and it is possible to foresee very high thermal capacities at given temperature ranges by choosing materials that undergo a change of state in such ranges.

Figure 3:
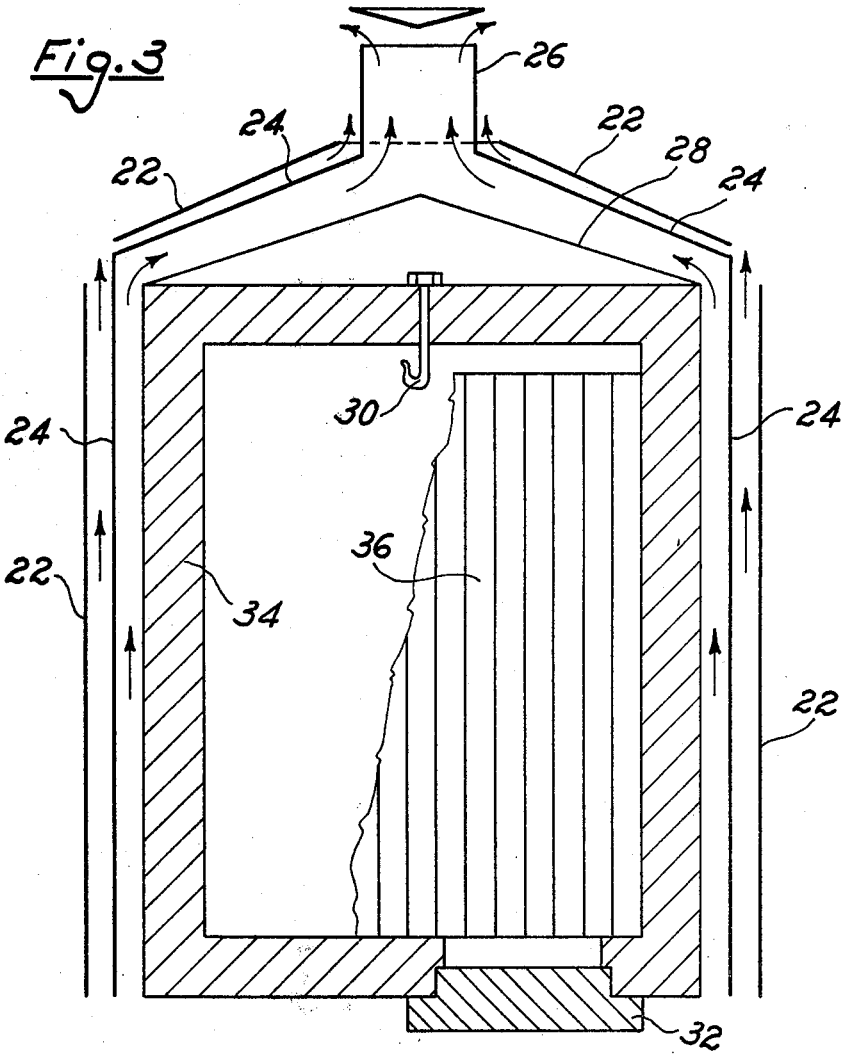
FIGS. 3 and 4 are a diagrammatic vertical section and a diagrammatic partial cross-section, respectively of a shelter according to this invention and particularly suitable for hot climates.
Figure 4:
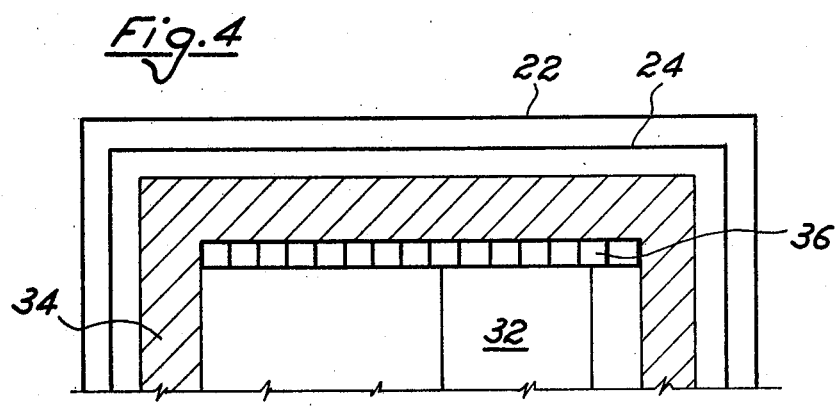

FIGS. 3 and 4 show an embodiment according to this invention, wherein the overheating effect of solar radiation on the shelter walls has been considered.

Such radiation may considerably increase the heat exchange in a discontinuous manner only statically foreseeable in view of the type of heat supply, thus changing all the calculation values and increasing the overall size and weight of the thermal capacity.

It is thus suitable to provide a solar radiation screen. In particular, according to the embodiment of FIGS. 3 and 4 a double outer solar screen 22,24 is provided, such screen being cooled by the natural air circulation induced by the wall heating, as shown by the arrows. A natural draft is ensured by the chimney effect for the outside screen 22 and by the chimney effect improved by a short stack 26 for the inner screen 24. The double screen makes it possible to protect the shelter against atmospheric agents. The walls of the double screen are made of a reflecting material in order to reduce heat transmission.

The shelter is still further protected by an upper sheet slide 28 against the possible accumulation of sand or the like. The upper wall carries a through bolt with a hook 30 at the inside of the shelter for an assembly winch for the electronic material.

At the shelter bottom a door 32 opens toward the outside with air-tight seals, such door being made of a frame with a heat-insulating packing. The shelter insulating layer 34 is made of foamed polyurethane, polystyrene or similar heat-insulating material.

The thermal capacity is fixed to the shelter inside walls. It consists of a set of plastic square tubes 36, slightly shorter than the total height of the wall and filled with a suitable liquid and sealed at the top and bottom.

In less severe climates and with higher admissible inner temperatures, it is possible to avoid the outer screen and, in case of minor requirements or improvements in the climatic conditions, also the inner solar screen.

Figure 5:
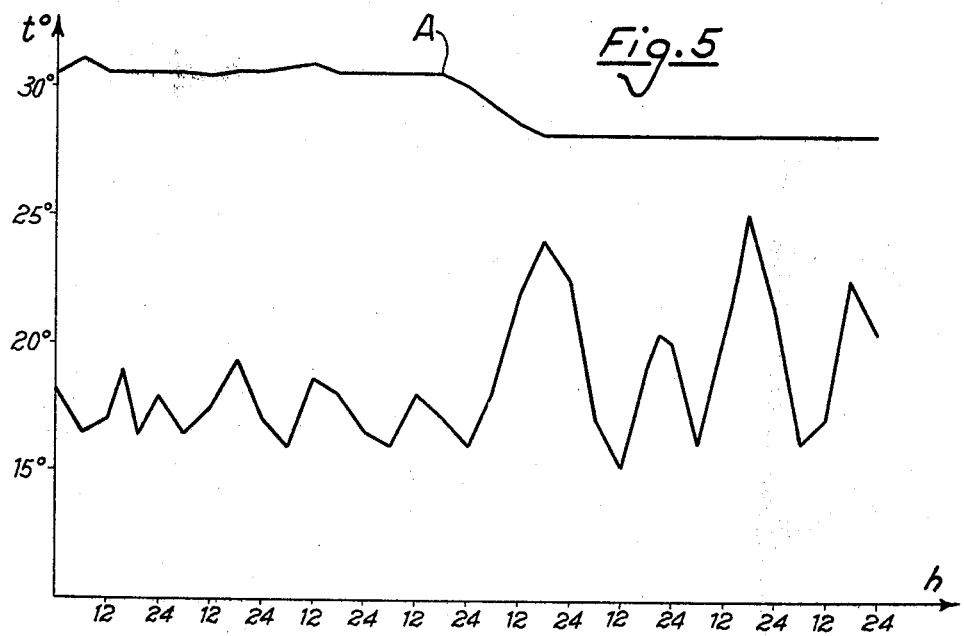
FIG. 5 is a diagram showing the results of tests carried out on a prototype under given operating conditions.

In a tested screenless embodiment, the sizes of the inner cell were 1.70×1.70×2 m with an insulation formed by a 30 cm thick foamed polystyrene layer. The thermal capacity was formed by 220 l. of water contained in 24 round plastic tubes 1.90 m height, inner diameter 80 mm. The results of tests carried-out with an inner dissipated power of 40 and 30 W are shown in the diagram of FIG. 5, wherein the upper curve indicates the shelter inside temperature (point A indicates a reduction of the dissipated power from 40 to 30 W) while the lower curve indicates the values of the outside temperatures.

The values of the thermal capacity shall be proportional to the desired damping of the outside temperature variations and to the thermal resistance of the walls.

It is to be understood that the illustrated embodiments may undergo modifications, in particular according to the operational requirements, without departing from the spirit and scope of this invention.

What we claim is:

1. A shelter for the protection of electronic apparatus from the surrounding exterior environment, said shelter comprising:

a closed box-like structure defining an interior space for housing electronic apparatus, the exterior of said box-like structure being exposed to the surrounding exterior environment;

said box-like structure having walls including thermal resistance means for decreasing the amount of heat transferred from said exterior environment through said box-like structure into said interior space when the temperature of said exterior environment is higher than the temperature of said interior space;

said box-like structure having in said interior space thereof thermal capacity means for absorbing said heat transferred from said exterior environment into said interior space, for absorbing heat generated in said interior space, and for dissipating heat through said walls to said exterior environment when said temperature of said exterior environment is lower than said temperature of said interior space;

said thermal resistance means and said thermal capacity means being sized and dimensioned to comprise means for maintaining said temperature of said interior space substantially constant and equal to the mean value of said temperature of said exterior environment during a predetermined period of time; and solar screen means positioned exterior of said box-like structure for reflecting solar radiation away from said box-like structure, said solar screen means defining with said box-like structure air space means for enabling the circulation therethrough of ambient air for cooling the exterior of said box-like structure.

2. A shelter as claimed in claim 1, wherein said thermal resistance means comprises thermal insulating material forming said walls of said box-like structure.

3. A shelter as claimed in claim 1, wherein said thermal resistance means comprises thermal insulating material joined with said walls of said box-like structure.

4. A shelter as claimed in claim 1, wherein said thermal capacity means comprises at least one material having a high specific heat.

5. A shelter as claimed in claim 1, wherein said thermal resistance means comprises plural resistances spaced from each other in a direction from the outside to the inside of said box-like structure.

6. A shelter as claimed in claim 1, wherein said thermal capacity means comprises containers of water.

7. A shelter as claimed in claim 6, wherein said containers comprise bundles of tubes.

8. A shelter as claimed in claim 1, further comprising temperature changing means extending into said interior space.

9. A shelter as claimed in claim 1, wherein said predetermined period of time is at least 24 hours.

* * * * *